(12) United States Patent
Iwaki (10) Patent No.: US 11,152,371 B2
(45) Date of Patent: Oct. 19, 2021

(54) APPARATUS COMPRISING MONOCRYSTALLINE SEMICONDUCTOR MATERIALS AND MONOCRYSTALLINE METAL SILICIDE MATERIALS, AND RELATED METHODS, ELECTRONIC DEVICES, AND ELECTRONIC SYSTEMS

(71) Applicant: Micron Technology, Inc., Boise, ID (US)

(72) Inventor: Takayuki Iwaki, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/539,520

(22) Filed: Aug. 13, 2019

(65) Prior Publication Data

US 2021/0050352 A1 Feb. 18, 2021

(51) Int. Cl.
| | |
|---|---|
| *H01L 27/108* | (2006.01) |
| *H01L 23/528* | (2006.01) |
| *H01L 29/45* | (2006.01) |
| *H01L 29/08* | (2006.01) |
| *H01L 21/3213* | (2006.01) |
| *H01L 21/02* | (2006.01) |
| *H01L 21/3205* | (2006.01) |

(52) U.S. Cl.
CPC .. *H01L 27/10855* (2013.01); *H01L 21/02532* (2013.01); *H01L 21/02576* (2013.01); *H01L 21/02595* (2013.01); *H01L 21/02598* (2013.01); *H01L 21/32053* (2013.01); *H01L 21/32135* (2013.01); *H01L 23/528* (2013.01); *H01L 27/10814* (2013.01); *H01L 27/10888* (2013.01); *H01L 27/10897* (2013.01); *H01L 29/0847* (2013.01); *H01L 29/456* (2013.01)

(58) Field of Classification Search
None
See application file for complete search history.

(56) References Cited

U.S. PATENT DOCUMENTS

| | | | |
|---|---|---|---|
| 5,536,684 A | 7/1996 | Dass et al. | |
| 5,641,694 A * | 6/1997 | Kenney | H01L 27/10841 |
| | | | 257/E21.131 |
| 6,281,102 B1 | 8/2001 | Cao et al. | |
| 6,410,429 B1 | 6/2002 | Ho et al. | |
| 6,878,627 B1 | 4/2005 | Lur et al. | |

(Continued)

FOREIGN PATENT DOCUMENTS

| | | |
|---|---|---|
| CN | 1260786 C | 6/2006 |
| JP | 1985-072242 A | 4/1985 |

(Continued)

*Primary Examiner* — Michelle Mandala
(74) *Attorney, Agent, or Firm* — TraskBritt (57) ABSTRACT

An apparatus comprising a memory array comprising wordlines, digit lines, and memory cells, with each memory cell coupled to an associated wordline and an associated digit line. Each memory cell comprises a monocrystalline silicon material adjacent to an access device, a monocrystalline metal silicide material directly contacting the monocrystalline semiconductor material, a metal material directly contacting the monocrystalline metal silicide material, and a storage device adjacent to the metal material. Electronic devices, electronic systems, and methods of forming an electronic device are also disclosed.

25 Claims, 9 Drawing Sheets

(56) References Cited

U.S. PATENT DOCUMENTS

| | | |
|---|---|---|
| 7,485,572 B2 | 2/2009 | Madan et al. |
| 7,820,505 B2 * | 10/2010 | Brederlow ........ H01L 27/10823 |
| | | 438/239 |
| 10,658,367 B1 * | 5/2020 | Simsek-Ege ........ H01L 27/1082 |
| 2002/0025673 A1 | 2/2002 | Song et al. |
| 2018/0083011 A1 | 3/2018 | Wang |
| 2018/0269211 A1 * | 9/2018 | Kim .................. H01L 21/02178 |
| 2018/0374855 A1 * | 12/2018 | Pandey ............. H01L 27/10814 |
| 2021/0013213 A1 * | 1/2021 | Kim .................. H01L 27/10891 |

FOREIGN PATENT DOCUMENTS

| | | |
|---|---|---|
| JP | 6072242 A | 4/1985 |
| JP | 2011-044640 A | 3/2011 |
| KR | 10-1999-0057823 A | 7/1999 |
| KR | 10-0209477 B1 | 7/1999 |
| KR | 10-2004-0001792 A | 1/2004 |
| KR | 10-0548546 B1 | 2/2006 |
| KR | 10-0623600 B1 | 9/2006 |

* cited by examiner

APPARATUS COMPRISING MONOCRYSTALLINE SEMICONDUCTOR MATERIALS AND MONOCRYSTALLINE METAL SILICIDE MATERIALS, AND RELATED METHODS, ELECTRONIC DEVICES, AND ELECTRONIC SYSTEMS

TECHNICAL FIELD

Embodiments disclosed herein relate to apparatus (e.g., electronic devices) and to fabrication of the apparatus. More particularly, embodiments of the disclosure relate to apparatus including monocrystalline metal silicide materials and monocrystalline semiconductor materials, and to related methods, electronic devices, and electronic systems.

BACKGROUND

Electronic device designers desire to increase the level of integration or density of features within an electronic device by reducing the dimensions of individual features and by reducing the separation distance between neighboring features. In addition, electronic device designers often desire to design architectures that are not only compact, but offer performance advantages, as well as simplified designs. A relatively common electronic device is a memory device. A memory device may include a memory array having a number of memory cells arranged in a grid pattern. One type of memory cell is a dynamic random access memory (DRAM) device, which is a volatile memory device that may lose a stored state over time unless the DRAM device is periodically refreshed by an external power supply. In the simplest design configuration, a DRAM cell includes one access device (e.g., a transistor) and one storage device (e.g., a capacitor). Modern applications for memory devices may utilize vast numbers of DRAM unit cells, arranged in an array of rows and columns. The DRAM cells are electrically accessible through digit lines and wordlines arranged along the rows and columns of the array.

As the dimensions and spacing of the features decrease, contact resistance increases due to the smaller feature sizes. To form contacts in conventional electronic devices, contact holes are formed that extend to active areas of the electronic device. Epitaxial growth of silicon is conducted in the contact holes and over the active areas, forming monocrystalline silicon, and polycrystalline silicon is formed over the monocrystalline silicon. The monocrystalline silicon and the polycrystalline silicon are doped with phosphorus. A metal silicide, such as cobalt silicide, is then formed over the polycrystalline silicon. However, the polycrystalline silicon contributes to the increased contact resistance in these conventional electronic devices. In other conventional electronic devices that include metal-insulator-semiconductor (MIS) contacts, the insulator, such as titanium oxide, is formed at a low thickness, such as from about 7 Å to about 10 Å. However, controlling the thickness of the insulator adds complexity and cost to the fabrication of the conventional electronic devices including the MIS contacts.

BRIEF DESCRIPTION OF THE SEVERAL VIEWS OF THE DRAWINGS

FIGS. 2A-13B are simplified, partial cross-sectional views illustrating embodiments of a method of forming the electronic device;

DETAILED DESCRIPTION

An apparatus (e.g., an electronic device, a semiconductor device, a memory device) is disclosed that includes digit line structures (bit line structures, data line structures), access line structures (e.g., wordline structures), and memory cells. Each of the memory cells is coupled to an associated access line structure and to an associated bit line structure. The apparatus includes a monocrystalline semiconductor material adjacent to (e.g., over) active areas of the apparatus, a metal silicide adjacent to (e.g., over) the monocrystalline semiconductor material, and a metal material over the metal silicide material. The monocrystalline semiconductor material, the metal silicide, and the metal material constitute a contact structure between an access device (e.g., a transistor) positioned adjacent to (e.g., below) the active areas and a storage device (e.g., storage node, a capacitor) over the metal material. The monocrystalline semiconductor material may be a monocrystalline silicon material. The metal silicide is a monocrystalline material that includes a silicide of monocrystalline silicon and the metal. To form the contact structure, the monocrystalline semiconductor material is formed by an epitaxial growth process, and a polycrystalline semiconductor material is formed by the epitaxial growth process and over the monocrystalline semiconductor material. The polycrystalline semiconductor material is selectively removed and a portion of the monocrystalline semiconductor material is converted to a monocrystalline metal silicide. A metal material is formed over the monocrystalline metal silicide.

By forming the metal silicide directly over (e.g., in direct contact with) the monocrystalline semiconductor material, the memory cells according to embodiments of the disclosure exhibit reduced contact resistance relative to contacts of conventional memory cells. The monocrystalline metal silicide reduces (e.g., eliminates) electron scattering relative to that produced by polycrystalline silicon in conventional contact structures. Therefore, electron mobility through the memory cells according to embodiments of the disclosure may be higher and electroresistivity may be lower. The reduced electron scattering also provides reduced contact resistance to the memory cells according to embodiments of the disclosure. The memory cells according to embodiments of the disclosure do not include polycrystalline silicon between the monocrystalline semiconductor material and the metal silicide. By eliminating polycrystalline silicon from the contact structures, a greater amount of the metal material may be utilized in the contact structures, which further reduces the contact resistance of the memory cells.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing an electronic device. The electronic devices described below do not form a complete electronic device. Only those process acts and structures necessary to understand the embodiments of the disclosure are described in detail below. Additional acts to form the complete electronic device may be performed by conventional fabrication techniques. Also note, any drawings accompanying the application are for illustrative purposes only, and are thus not drawn to scale. Additionally, elements common between figures may retain the same numerical designation.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization), or other known methods.

Drawings presented herein are for illustrative purposes only, and are not meant to be actual views of any particular material, component, structure, device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "apparatus" includes without limitation electronic devices, memory devices, as well as semiconductor devices, which may or may not incorporate memory, such as a logic device, a processor device, or a radiofrequency (RF) device. Further, an apparatus may incorporate memory in addition to other functions such as, for example, a so-called "system on a chip" (SoC) including a processor and memory, or an electronic device including logic and memory. The apparatus may, for example, be a three-dimensional (3D) electronic device including, but not limited to, a dynamic random access memory (DRAM) device.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the term "contact" means and includes a connection facilitating a conductive pathway between at least two structures of the electronic device. For example, in a DRAM device exhibiting a dual bit memory cell structure, a digit line contact is provided between a digit line and an access device (e.g., a transistor) formed in or above a substrate, and a storage device contact is formed between the access device and the storage device (e.g., a capacitor) where electrical charge may be stored.

As used herein, the term "contact structure" means and includes a connection structure including the monocrystalline semiconductor material, the monocrystalline metal silicide, and the metal material between the access device and the storage device.

As used herein, the term "epitaxial growth" means and includes a material formed by a growth process in which the to-be-formed material has a crystal orientation (e.g., a crystal form, a crystal state) substantially similar to the crystal orientation of the material on which it is formed.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1A:
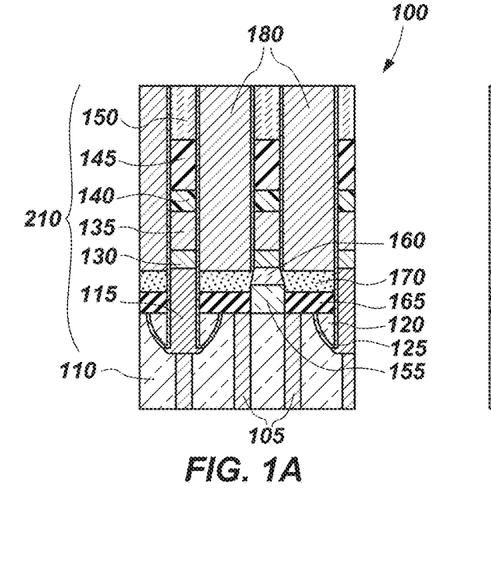
FIGS. 1A and 1B are simplified, partial cross-sectional views of an electronic device including contact structures according to embodiments of the disclosure.
Figure 1B:
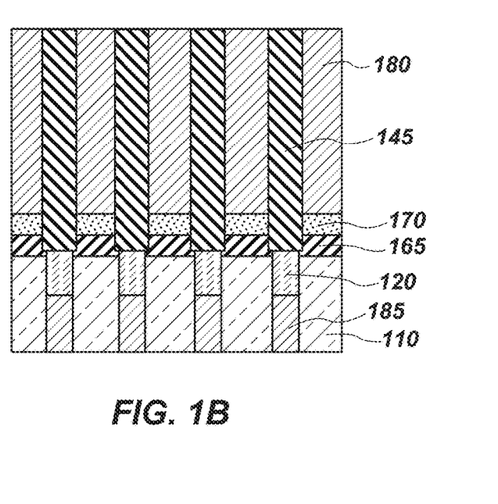

An apparatus 100 including active areas 105, shallow trench isolation (STI) structures 110, digit contacts 115, diffusion regions 120, insulative spacer material 125, barrier metal material 130, digit lines 135, insulative cap materials 140, 145, digit line caps 150, etch stop material 155, undoped polycrystalline silicon 160, monocrystalline silicon material 165 (e.g., epitaxial silicon material), metal silicide 170, and cell contacts 180 is shown in FIG. 1A, which is a cross-sectional view of the apparatus 100 in a first direction (e.g., a digit line direction). Digit line structures 210 include the digit lines 135 and the materials vertically adjacent to the digit lines 135. FIG. 1B illustrates the apparatus 100 in a second direction (e.g., a wordline direction) perpendicular to the first direction, with wordlines 185, the STI structures 110, etch stop material 190, the monocrystalline silicon material 165, the metal silicide 170, and the cell contacts 180. The monocrystalline silicon material 165 is on (e.g., directly on, directly contacts) the active areas 105 and the STI structures 110, as shown in FIGS. 1A and 1B. The metal silicide 170 is on (e.g., directly on, directly contacts) the monocrystalline silicon material 165. Both the metal silicide 170 and the monocrystalline silicon material 165 exhibit a monocrystalline orientation. The cell contact 180 is on (e.g., directly on, directly contacts) the metal silicide 170. The monocrystalline silicon material 165, the metal silicide 170, and the cell contacts 180 constitute contact structures 195 and separate adjacent digit lines 135 from one another in the digit line direction. In the wordline direction, the contact structures 195 (e.g., the monocrystalline silicon material 165, the metal silicide 170, and the cell contacts 180) are positioned over the STI structures 110.

FIGS. 2A through 13B are simplified partial cross-sectional views illustrating embodiments of forming an electronic device (e.g., a memory device, such as a DRAM device) including the contact structures 195. With the description provided below, it will be apparent to one of ordinary skill in the art that the methods described herein may be used in the fabrication of various electronic devices and not only DRAM devices.

Figure 2A:
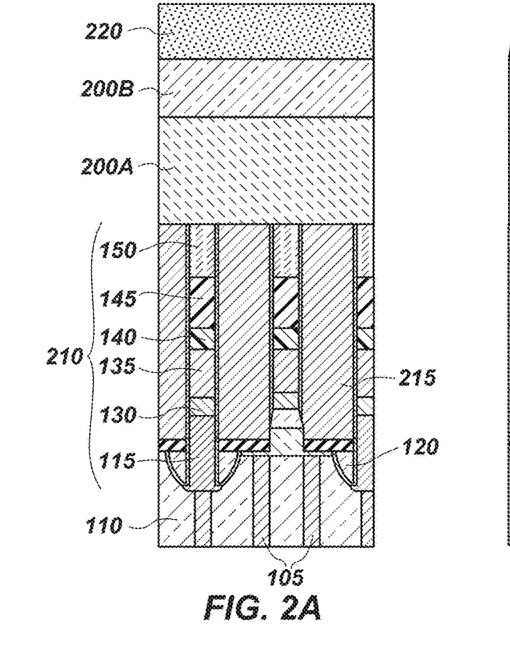
Figure 2B:
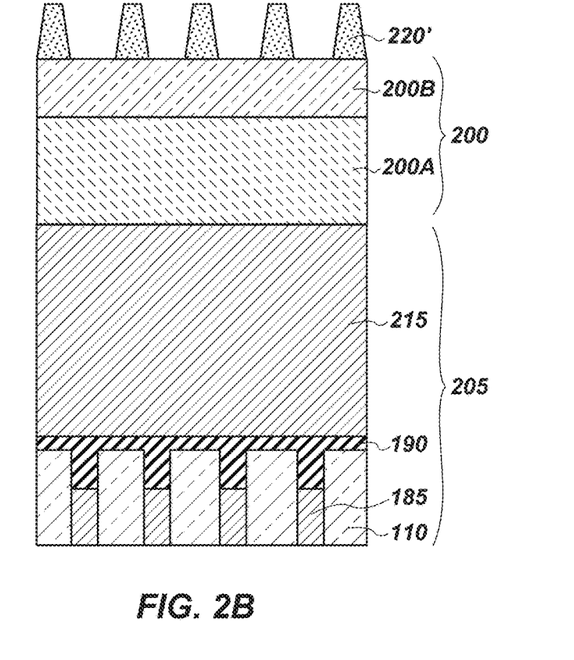

As shown in FIGS. 2A and 2B, a mask 200 is formed adjacent to (e.g., vertically adjacent to, over) a semiconductor structure 205 that has been subjected to previous fabrication acts to form features thereon or therein. FIG. 2A is a cross-sectional view illustrating the semiconductor structure 205 in the digit line direction and FIG. 2B is a cross-sectional view illustrating the semiconductor structure 205 in the wordline direction, with the digit line direction and the wordline direction being perpendicular to one another. The features of the semiconductor structure 205 are formed by conventional techniques. The semiconductor structure 205 includes digit line structures 210 including the digit lines 135 adjacent to (e.g., over) the active areas 105 or the STI structures 110. The digit line structures 210 may also include vertically adjacent materials, such as the digit contacts 115, the digit line caps 150, etc. The digit line structures 210, the active areas 105, and the STI structures 110 are formed by conventional techniques. The digit lines 135 may be formed from an electrically conductive material, such as a metal, a metal alloy, a metal-containing material, a metal nitride, a metal silicide, a metal carbide, a metal oxide, or a doped semiconductor material. By way of example only, the electrically conductive material may include, but is not limited to, tungsten, titanium, nickel, platinum, gold, conductively-doped silicon, conductively-doped germanium, conductively-doped silicon germanium, titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide ($IrO_x$), elemental ruthenium (Ru), ruthenium oxide ($RuO_x$), a combination thereof, or an alloy thereof. In some embodiments, the digit lines 135 are formed of tungsten.

The active areas 105 are formed from monocrystalline silicon, such as doped monocrystalline silicon, and may be isolated from one another by the STI structures 110, which are formed from silicon dioxide (Sift). By way of example only, the active areas 105 may be formed of n-doped silicon. The semiconductor structure 205 also includes the wordlines 185 and the etch stop material 190 adjacent to (e.g., over) the wordlines 185. The wordlines 185 may be formed of one of the previously-mentioned electrically conductive materials and are isolated from one another by the STI structures 110. In some embodiments, the wordlines 185 are formed of tungsten. The etch stop material 190 may be formed of a dielectric material that is selectively etchable relative to one or more other dielectric materials used during the fabrication process. The dielectric material may include, but is not limited to, a nitride dielectric material, an oxynitride dielectric material, a carbonitride dielectric material, or a carboxynitride dielectric material. The etch stop material 190 may include, but is not limited to, silicon nitride. The wordlines 185 and the etch stop material 190 are formed by conventional techniques. A first dielectric material 215 is formed between the digit lines 135 and adjacent to (e.g., over) the wordlines 185 and the etch stop material 190. The first dielectric material 215 may, for example, be a spin-on silicon dioxide material.

The mask 200 may include one or more materials that provide etch selectivity or patterning capabilities during subsequent process acts. The one or more materials may include, but are not limited to, a carbon material, an anti-reflection material, another mask material, or a combination thereof. As shown in FIGS. 2A and 2B, a first mask material 200A may be formed over the digit line structures 210 and over the first dielectric material 215, and a second mask material 200B may be formed over the first mask material 200A. In some embodiments, the first mask material 200A is carbon and the second mask material 200B is an anti-reflection material. A silicon oxide material 220 may be formed over the second mask material 200B. The first mask material 200A, the second mask material 200B, and the silicon oxide material 220 may be formed by conventional techniques.

The silicon oxide material 220 may be patterned by conventional photolithography techniques to form a patterned silicon oxide material 220' in the wordline direction, as shown in FIG. 2B, while the silicon oxide material 220 in the digit line direction remains substantially unpatterned, as shown in FIG. 2A. By way of example only, the silicon oxide material 220 may be subjected to a conventional pitch doubling process to produce the patterned silicon oxide material 220'. The pattern of the patterned silicon oxide material 220' corresponds to a pattern of the cell contacts 180 (see FIG. 1) ultimately to be formed in the electronic device.

Figure 3A:
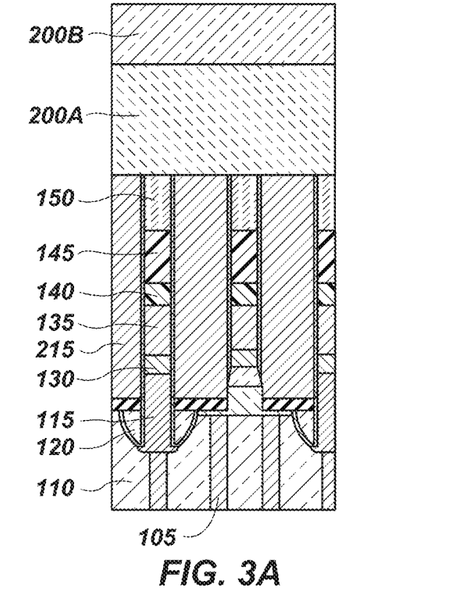
Figure 3B:
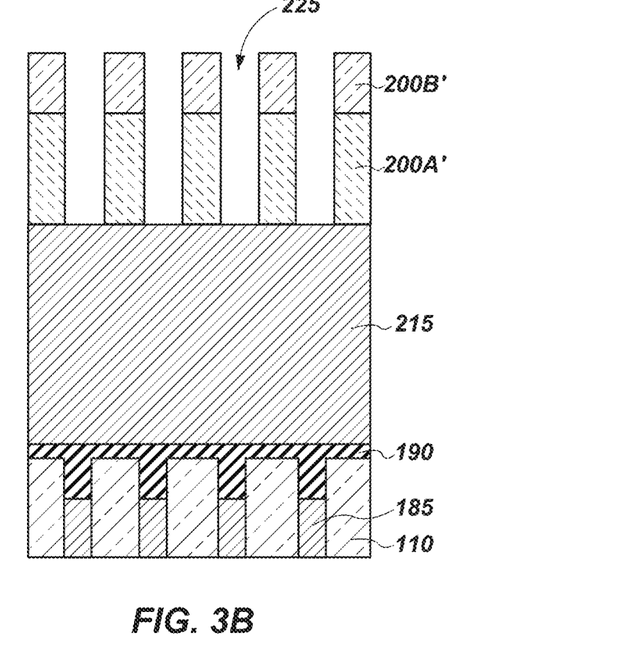

As shown in FIGS. 3A and 3B, the pattern of the patterned silicon oxide material 220' may be transferred into the second mask material 200B and the first mask material 200A, forming patterned second mask material 200B' and patterned first mask material 200A' in the wordline direction. Portions of the second mask material 200B and the first mask material 200A exposed through the patterned silicon oxide material 220' are removed, forming mask openings 225. The mask openings 225 extend into and through the second mask material 200B and the first mask material 200A, exposing an upper surface of the first dielectric material 215. The second mask material 200B and the first mask material 200A are patterned by one or more conventional removal acts, such as by one or more conventional removal acts. The exposed portions of the second mask material 200B and the first mask material 200A may be removed by an etch process, such as by a dry etch process, to form the patterned second mask material 200B' and the patterned first mask material 200A'. The patterned silicon oxide material 220' may also be removed by a conventional removal act, such as by a dry etch process.

Figure 4A:
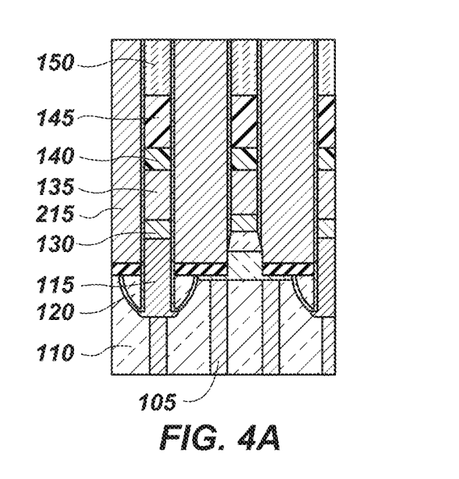
Figure 4B:
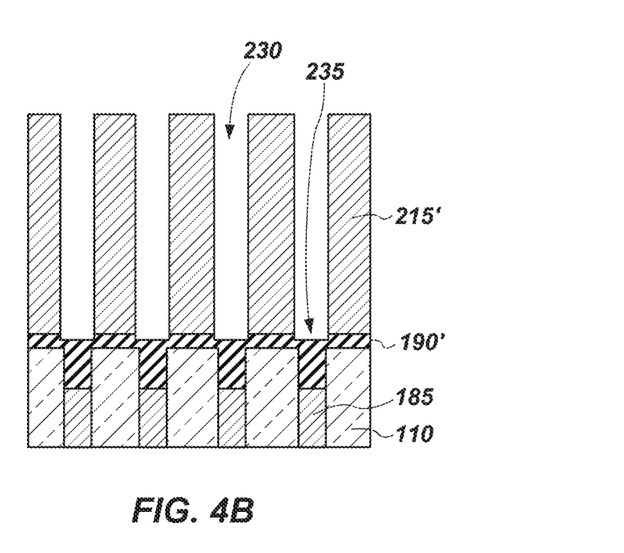

The pattern in the patterned second mask material 200B' and the patterned first mask material 200A' may be transferred into the first dielectric material 215, as shown in FIGS. 4A and 4B, forming a patterned first dielectric material 215' in the wordline direction. Portions of the first dielectric material 215 exposed through the patterned second mask material 200B' and the patterned first mask material 200A' are removed by conventional techniques, such as by a dry etch process that removes the exposed first dielectric material 215 overlying the wordlines 185. The patterned first dielectric material 215' includes first dielectric material openings 230 formed into and through the first dielectric material 215, exposing an upper surface of the etch stop material 190. The removal of the first dielectric material 215 may be conducted until the etch stop material 190 overlying the wordlines 185 is exposed. During the removal of the first dielectric material 215, a portion of the etch stop material 190 overlying the wordlines 185 may also be removed, forming recesses 235 in the etch stop material 190. After removing the portions of the first dielectric material 215, the patterned second mask material 200B' and the patterned first mask material 200A' may be removed in the digit line and the wordline directions by conventional techniques. The location of the first dielectric material 215 remaining in the patterned first dielectric material 215' may correspond to the location of contact holes 245 (see FIGS. 7A and 7B) in which metal material 260 (see FIGS. 12A and 12B) of the cell contacts 180 is ultimately formed. The remaining first dielectric material 215 of the patterned first dielectric material 215' in the wordline direction overlies the STI structures 110.

Figures 5A, 5B:
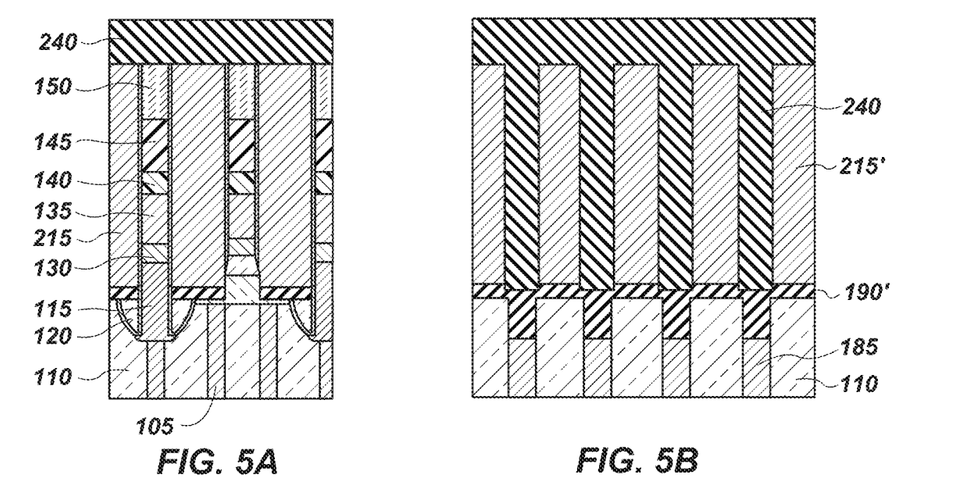

A second dielectric material 240 may be formed over the digit lines 135 and in the first dielectric material openings 230, as shown in FIGS. 5A and 5B. The second dielectric material 240 and the first dielectric material 215 may be selectively etchable relative to one another. The second dielectric material 240 may be formed by conventional techniques and may substantially fill the first dielectric material openings 230 and form over the upper surface of the patterned first dielectric material 215'. The second dielectric material 240 may, for example, be silicon nitride. The second dielectric material 240 overlies the patterned first dielectric material 215' and forms a so-called "wall" between adjacent portions of the patterned first dielectric material 215'. In some embodiments, the etch stop material 190 and the second dielectric material 240 are formed of silicon nitride.

Figures 6A, 6B:
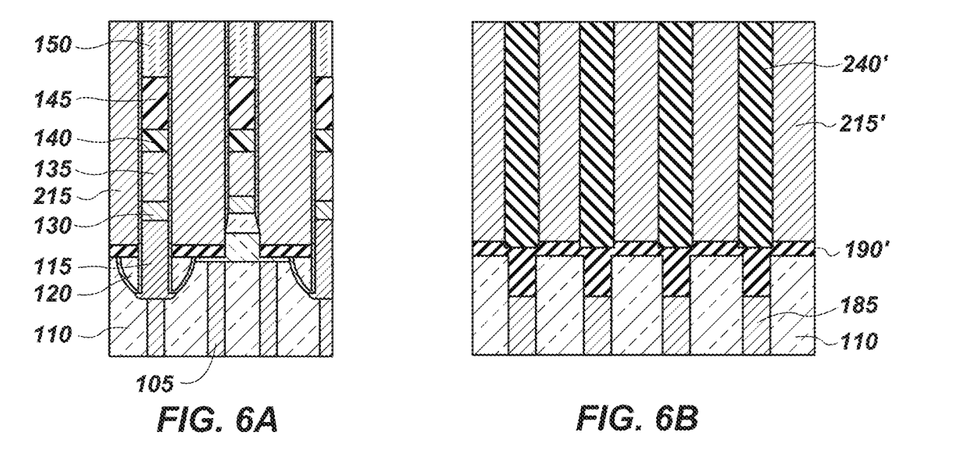

As shown in FIGS. 6A and 6B, a portion of the second dielectric material 240 overlying an upper surface of the patterned first dielectric material 215' may be removed by conventional techniques, such as by an etch act, forming patterned second dielectric material 240'. The etch act may substantially remove the second dielectric material 240 overlying the digit line structures 210 and overlying the patterned first dielectric material 215' in the digit line direction. In the wordline direction, the second dielectric material 240 overlying the patterned first dielectric material 215' and a portion of the second dielectric material 240 in the first dielectric material openings 230 may be removed, exposing an upper surface of the patterned first dielectric material 215'. The second dielectric material 240 overlying the wordlines 185 may be recessed such that an upper surface of the patterned second dielectric material 240' is lower than the upper surface of the patterned first dielectric material 215'.

Figure 7A:
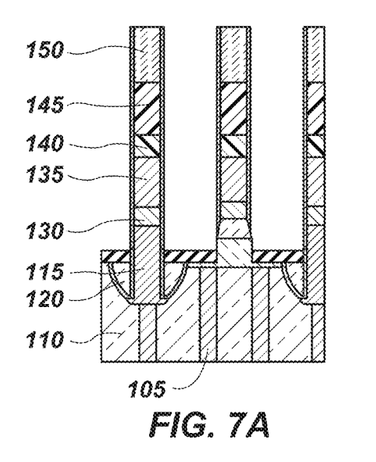
Figure 7B:
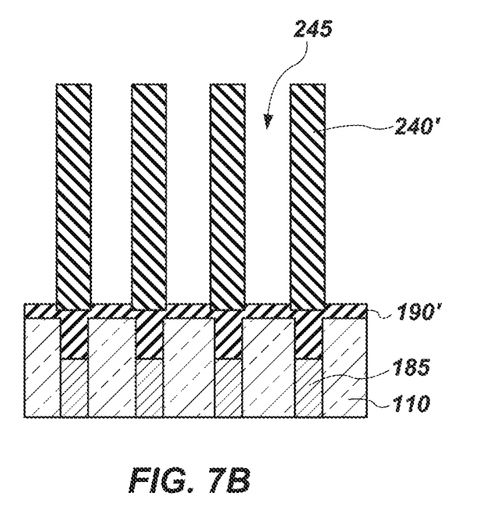

The patterned first dielectric material 215' may be removed, as shown in FIGS. 7A and 7B, exposing the digit line structures 210 including the digit lines 135 in the digit line direction and forming contact holes 245. Since the first dielectric material 215 and the second dielectric material 240 are selectively etchable relative to one another, substantially all of the patterned first dielectric material 215' is removed without substantially removing the patterned second dielectric material 240'. An etch act may be conducted to selectively remove the patterned first dielectric material 215', such as a wet etch act. By way of example only, a hydrogen fluoride wet etch may be conducted to substantially remove the patterned first dielectric material 215' in the digit line direction and the wordline direction. The contact holes 245 are defined by sidewalls of the patterned second dielectric material 240' and an upper surface of the etch stop material 190. Substantially all of the patterned first dielectric material 215' is removed in the digit line and wordline directions, with the etch stop material 190 preventing overetch of underlying materials. A size (e.g., an area) of the contact holes 245 may be selected to ultimately provide sufficient electrical contact between the cell contacts 180 formed in the contact holes 245 and the active areas 105. The contact holes 245 may be formed to a desired size initially or the contact holes 245 may be formed at an initial size and subsequently enlarged.

Figure 8A:
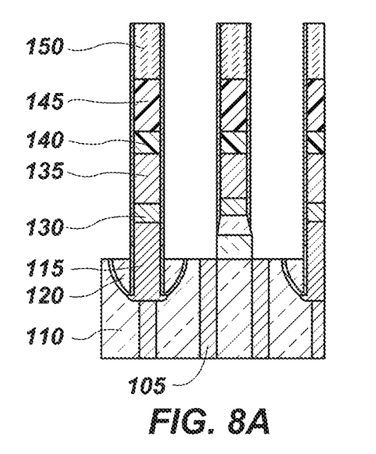
Figure 8B:
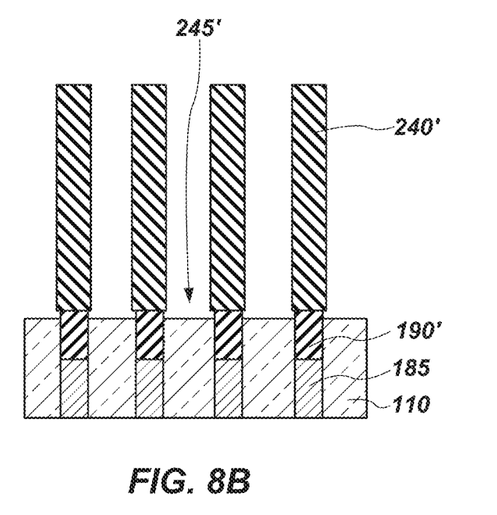

As shown in FIGS. 8A and 8B, exposed portions of the etch stop material 190 over the STI structures 110 and the active areas 105 may be removed, such as by an etch act. By way of example only, the etch act may be a dry etch act. Removing the etch stop material 190 extends a depth of the contact holes 245' and exposes upper surfaces of the STI structures 110 and the active areas 105. In the digit line direction, the contact holes 245' are defined by sidewalls of the digit line structures 210, an upper surface of the active areas 105, and an upper surface of the STI structures 110. In the wordline direction, the contact holes 245' are defined by the sidewalls of the patterned second dielectric material 240', sidewalls of the etch stop material 190 positioned below the patterned second dielectric material 240', and an upper surface of the STI structures 110. The contact holes 245' extend to the STI structures 110 in the wordline direction and to the active areas 105 and the STI structures 110 in the digit line direction.

Figure 9A:
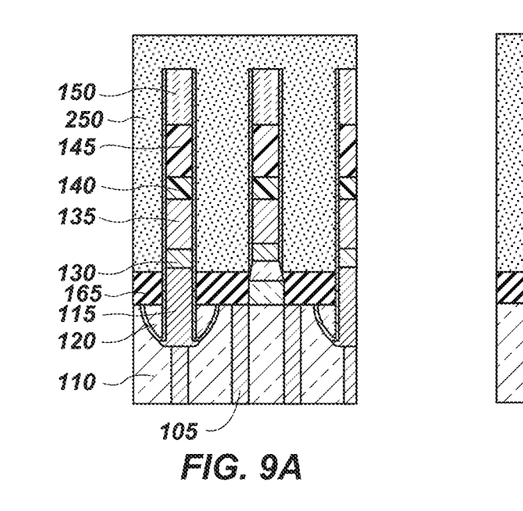
Figure 9B:
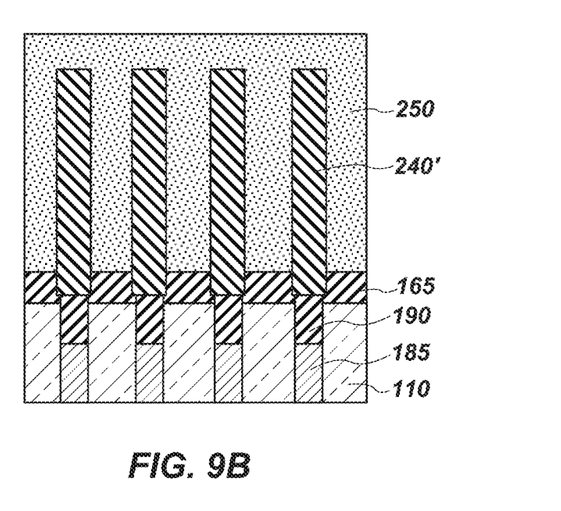

Monocrystalline silicon material 165 (e.g., epitaxial silicon) and polycrystalline silicon 250 may be formed over the STI structures 110 and the active areas 105, as shown in FIGS. 9A and 9B. The monocrystalline silicon material 165 is formed over the STI structures 110 and the active areas 105 and in between adjacent digit line structures 210 and adjacent portions of the patterned second dielectric material 240'. The polycrystalline silicon 250 is formed over the monocrystalline silicon material 165. The monocrystalline silicon material 165 and the polycrystalline silicon 250 may be doped, such as with an n-type dopant. The monocrystalline silicon material 165 and the polycrystalline silicon 250 may, for example, be implanted with phosphorus atoms (i.e., P-doped monocrystalline silicon material 165, P-doped polycrystalline silicon 250) or other dopant atoms. The doping of the monocrystalline silicon material 165 and the polycrystalline silicon 250 may be conducted by conventional techniques. In some embodiments, the monocrystalline silicon material 165 is P-doped monocrystalline silicon material 165 and the polycrystalline silicon 250 is P-doped polycrystalline silicon 250. Forming (e.g., epitaxially growing) the silicon of the monocrystalline silicon material 165 adjacent to (e.g., over) the active areas 105 enables the silicon to be formed in the monocrystalline (e.g., single crystal) orientation. The silicon of the active areas 105 functions as a seed material to orient the crystal form of the monocrystalline silicon material 165. The monocrystalline silicon material 165 is formed on the diffusion regions 120, which include first diffusion region 120A and second diffusion region 120B. In some embodiments, the first diffusion region 120A and second diffusion region 120B are formed from monocrystalline silicon.

The monocrystalline silicon material 165 and the polycrystalline silicon 250 may be selectively etchable relative to one another. The polycrystalline silicon 250 may also be selectively etchable relative to the patterned second dielectric material 240'. The monocrystalline silicon material 165 and the polycrystalline silicon 250 are formed in the contact holes 245' by an epitaxial growth process and substantially completely fill the contact holes 245'. The monocrystalline silicon material 165 and the polycrystalline silicon 250 are formed by a substantially continuous process in which process conditions remain constant (e.g., are not substantially changed) as both the monocrystalline silicon material 165 and the polycrystalline silicon are formed. Without being bound by any theory, the substantially continuous process may enable the monocrystalline silicon material 165 and the polycrystalline silicon 250 to be formed without forming native oxides on the monocrystalline silicon material 165. The substantially continuous process may include, for example, removing native oxides (if present) on the surface of the active areas 105 and flowing silane (SiH$_4$) gas in the contact holes 245' at a temperature of about 470° C. and a pressure of about 1.2 Torr. Therefore, both monocrystalline (e.g., single crystal) and polycrystalline forms of silicon are formed in the contact holes 245' by a single, substantially continuous process. The monocrystalline silicon material 165 is formed initially in the contact holes 245' and the polycrystalline silicon 250 is subsequently formed over the monocrystalline silicon material 165. Each of the monocrystalline silicon material 165 and the polycrystalline silicon 250 may be subsequently doped.

Without being bound by any theory, it is believed that epitaxial growth of the monocrystalline silicon material 165 over the active areas 105 and STI structures 110 occurs due to the crystal orientation of the silicon of the active areas 105. The crystal orientation of the active areas 105 affects the crystal orientation of the subsequently formed monocrystalline silicon material 165. As the epitaxial growth of the monocrystalline silicon material 165 proceeds towards and up the sidewalls of the patterned second dielectric material 240' (defining the contact holes 245'), the crystal orientation of the silicon changes to polycrystalline silicon. In other words, the formation of the monocrystalline silicon material 165 stops and changes to forming polycrystalline silicon 250. A location at which the monocrystalline silicon material 165 changes to the polycrystalline silicon 250 may be controlled by adjusting a thickness of the monocrystalline silicon material 165 by surface conditions of the active areas 105 and a critical dimension (CD) of the cell contacts 180. Therefore, the monocrystalline silicon material 165 is formed in the contact holes 245' to an initial thickness by the epitaxial growth process and the polycrystalline silicon 250 is formed by the epitaxial growth process to substantially completely fill the contact holes 245'. The initial thickness of the monocrystalline silicon material 165 may be controlled by adjusting the size of the contact holes 245' in which the monocrystalline silicon material 165 is formed. The contact holes 245' may be formed at an initial, desired size or may be initially formed at a smaller size and then widened to the desired size. The monocrystalline silicon material 165 may be formed in the contact holes 245' at a thickness of from about 20 nm to about 35 nm and the polycrystalline silicon 250 may be formed at a thickness of from about 30 nm to about 60 nm.

Figure 10A:
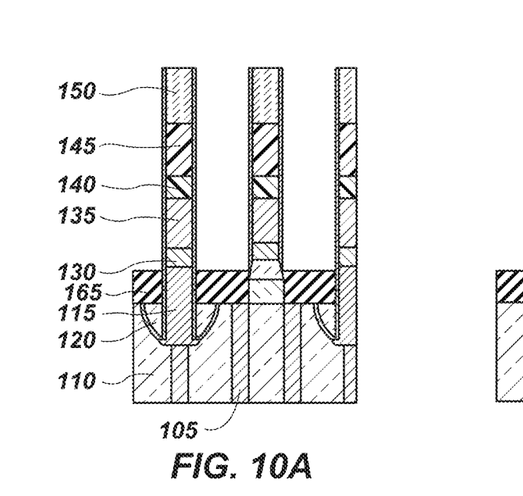
Figure 10B:
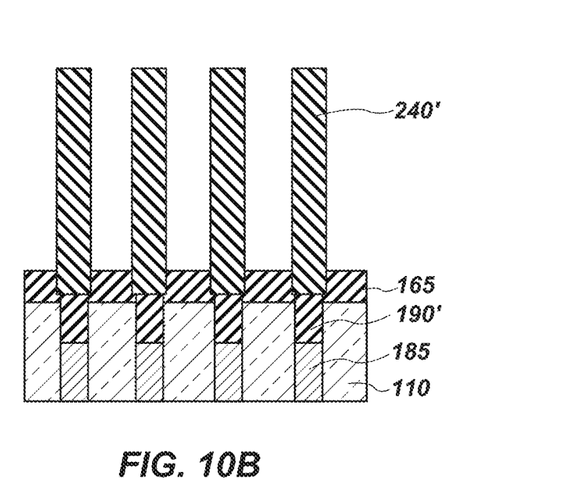

As shown in FIGS. 10A and 10B, the polycrystalline silicon 250 may be substantially completely removed by an etch act, such as by a dry etch act. The etch act may selectively remove the polycrystalline silicon 250 from the contact holes 245' without substantially removing the patterned second dielectric material 240' or the monocrystalline silicon material 165. To achieve substantially complete removal of the polycrystalline silicon 250, the etch act may be conducted for an amount of time sufficient to remove the polycrystalline silicon 250 and to remove a minimal portion of the monocrystalline silicon material 165. If, for example, the monocrystalline silicon material 165 is formed at a thickness of from about 20 nm to about 35 nm, about 5 nm or less of the monocrystalline silicon material 165 may be removed during the etch act such that from about 15 nm to about 30 nm of the monocrystalline silicon material 165 remains. The etch act may utilize conventional etch conditions, such as an etch chemistry including a sulfur hexafluoride ($SF_6$)/argon dry etch.

Figure 11A:
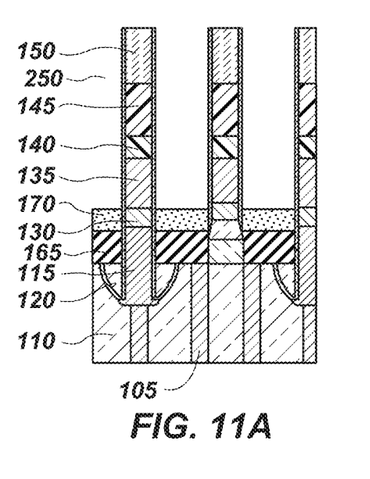
Figure 11B:
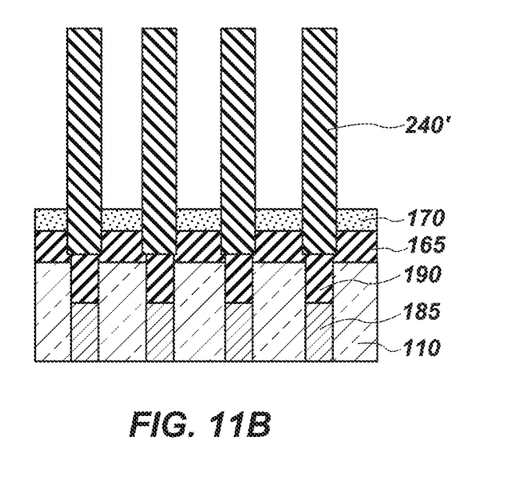

After removing the polycrystalline silicon 250, a metal silicide 170 may be formed adjacent to (e.g., over) the monocrystalline silicon material 165, as shown in FIGS. 11A and 11B. The metal silicide 170 may be formed over the monocrystalline silicon material 165 in the digit line direction and in the wordline direction. The metal of the metal silicide 170 may be a transition metal including, but not limited to, cobalt, molybdenum, nickel, palladium, platinum, tantalum, titanium, or tungsten. The metal silicide 170 may be cobalt silicide (CoSi), molybdenum silicide (MoSi), nickel silicide (NiSi), palladium silicide (PdSi), platinum silicide (PtSi), tantalum silicide (TaSi), titanium silicide (TiSi), or tungsten silicide (WSi). The metal silicide 170 may be formed by a silicidation process that is conducted after cleaning the contact holes 245' and the monocrystalline silicon material 165. The metal silicide 170 may be formed in the contact holes 245' by sputtering the metal from a target, conducting an anneal act, and conducting a wet etch act. By way of example only, a dilute hydrogen fluoride (300:1 water:hydrogen fluoride) wet etch chemistry may be used to clean the contact holes 245', followed by sputtering cobalt from a cobalt target into the contact holes 245' to form about 3 nm of cobalt, conducting a rapid thermal anneal (RTA) act at about 660° C. for about 25 seconds, and using a wet etch chemistry including hydrogen sulfide to remove excess cobalt. With the silicidation act, a portion, such as an upper portion, of the monocrystalline silicon material 165 is converted to the metal silicide 170. The metal silicide 170A may be formed at a thickness of from about 1 nm to about 5 nm. The metal silicide 170 is in direct contact with the monocrystalline silicon material 165 and may be a single crystalline metal silicide as formed. In some embodiments, the metal silicide 170 is cobalt silicide ($CoSi_2$), such as single crystalline cobalt silicide, and the monocrystalline semiconductor material is a doped monocrystalline silicon. In comparison, conventional contacts include polycrystalline cobalt silicide in direct contact with polycrystalline silicon, which directly contacts the monocrystalline silicon.

Figure 12A:
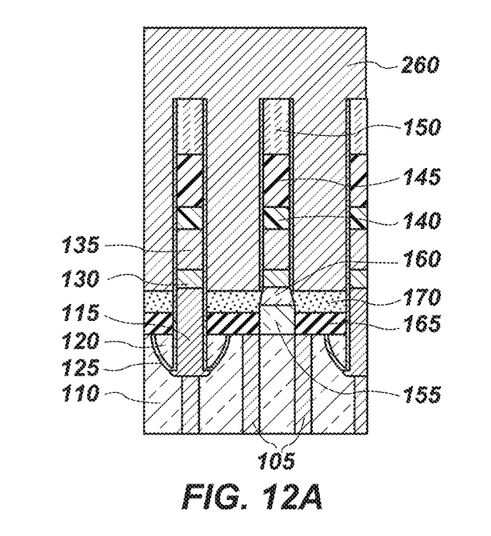
Figure 12B:
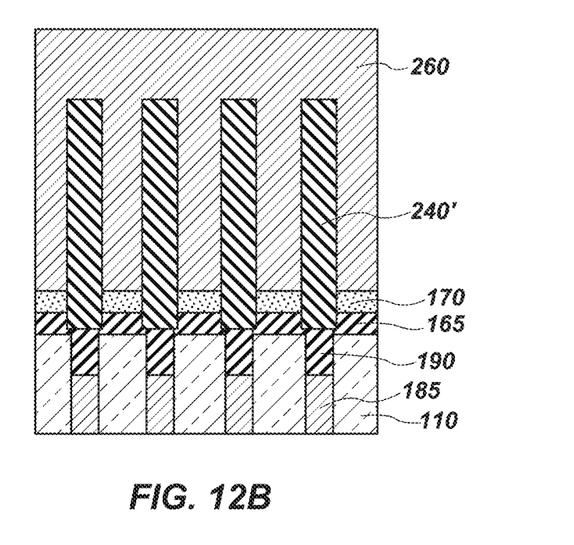
Figure 13A:
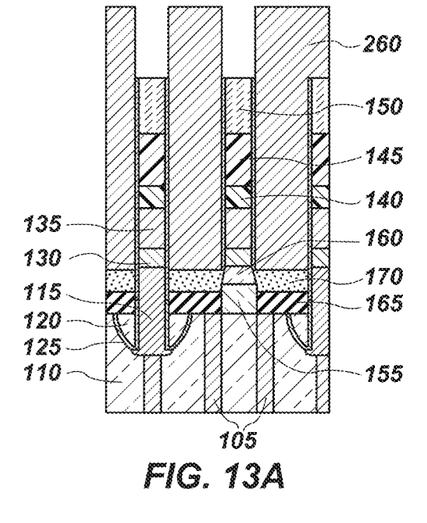
Figure 13B:
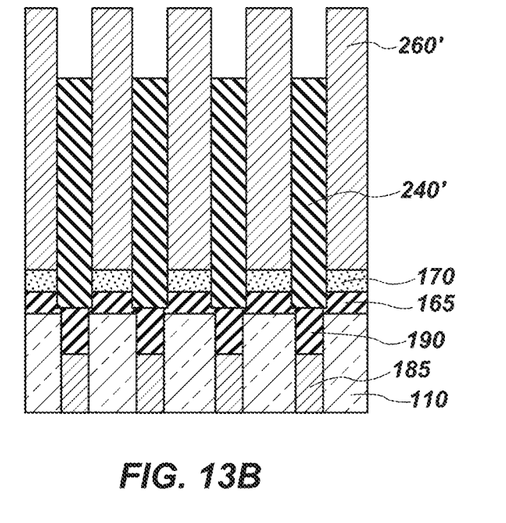

A metal material 260 may be formed over the metal silicide 170 and between adjacent digit lines 135 and adjacent portions of the patterned second dielectric material 240', as shown in FIGS. 12A and 12B. The metal material 260 may be formed in the digit line direction and in the wordline direction by conventional techniques. The metal material 260 may be a transition metal, a metal alloy, a metal nitride, a metal silicide, a metal carbide, or a metal oxide including, but not limited to, tungsten, titanium, nickel, platinum, gold, rhodium, iridium, ruthenium, ruthenium oxide, titanium nitride, tantalum nitride, tungsten nitride, titanium aluminum nitride, or alloys thereof. In some embodiments, the metal material 260 is tungsten. Subsequent process acts may be conducted to form the cell contacts 180 from the metal material 260. For example, the metal material 260 may be patterned by conventional photolithography and etch techniques to form the cell contacts 180, as shown in FIGS. 13A and 13B.

The resulting cell contacts 180 may function as redistribution material (RDM) structures with the metal silicide 170 configured and formulated to couple (e.g., physically couple, electrically couple) the active areas 105 to the cell contacts 180. By way of example only, the cell contacts 180 may correspond to a landing pad for a storage device, such as a capacitor. The cell contacts 180 according to embodiments of the disclosure may be larger in size than conventional contacts since no polycrystalline silicon is present in the contact structure 195. Since conventional contacts include polycrystalline silicon over epitaxial silicon, cobalt silicide over the polycrystalline silicon, and metal of the contacts over the cobalt silicide, the amount of space occupied by the metal of the conventional contacts is smaller than the amount of space occupied by the metal material 260 of the contact structures 195 according to embodiments of the disclosure. Therefore, a larger amount of the metal material 260 of the cell contacts 180 may be present relative to the conventional contacts. Since the contact structures 195 lack polycrystalline silicon, the cell contacts 180 may be larger (i.e., more metal material 260 may be present) and occupy more space in the contact structures 195. By having an increased amount of the metal material 260 in the contact structures 195 and having the metal silicide 170 in direct contact with the monocrystalline silicon material 165, the contact resistance of the electronic device is reduced. By way of example only, the contact resistance of the electronic device may be reduced by about 20%.

Without being bound by any theory, it is believed that mobility of electrons in an electronic device including the contact structures 195 according to embodiments of the disclosure is increased due to the monocrystalline orientations of the monocrystalline silicon material 165 and the metal silicide 170, which are in direct contact with one another. With the monocrystalline orientation, the electrons are mobile and move in a substantially straight path through the monocrystalline silicon material 165 and the metal silicide 170 during use and operation of the electronic device including the contact structures 195. By utilizing the metal silicide 170 in the monocrystalline orientation, the electron mobility is increased and the electron scattering is decreased compared to conventional contacts including a metal silicide formed from polycrystalline silicon. The increased electron mobility and decreased electron scattering reduces the contact resistance of the electronic device. In comparison, when the materials are in polycrystalline orientations, such as in conventional contacts, the electrons scatter and do not move in a substantially straight path. The lower mobility of the electrons in the polycrystalline material causes reduced current, which leads to increased contact resistance.

Figure 14A:
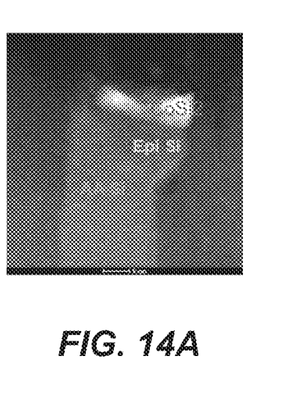
FIGS. 14A and 14B are micrographs of contact structures according to embodiments of the disclosure.
Figure 14B:
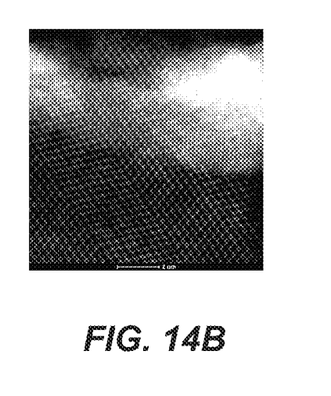

If cobalt silicide is used as the metal silicide 170 and is formed over the monocrystalline silicon material 165 by the silicidation process, the resulting cobalt silicide is monocrystalline and is formed in direct contact with the monocrystalline silicon material 165, which is formed over (i.e., in direct contact with) the monocrystalline silicon of the active areas 105, as shown in FIG. 14A. No agglomeration of the cobalt silicide is observed. An enlarged view of an interface between the cobalt silicide and the monocrystalline silicon material 165 is shown in FIG. 14B.

Accordingly, an apparatus comprising a memory array is disclosed, the memory array comprising wordlines, bit lines, and memory cells, with each memory cell coupled to an associated wordline and an associated bit line. Each memory cell comprises an access device, a monocrystalline semiconductor material epitaxially grown on the access device, a metal silicide material of a part of the monocrystalline semiconductor material and a metal, a metal plug material over the metal silicide material, and a storage node over the metal plug material.

Accordingly, an apparatus comprising a memory array is disclosed, the memory array comprising wordlines, digit lines, and memory cells, with each memory cell coupled to an associated wordline and an associated digit line. Each memory cell comprises a monocrystalline silicon material adjacent to an access device, a monocrystalline metal silicide material directly contacting the monocrystalline semiconductor material, a metal material directly contacting the monocrystalline metal silicide material, and a storage device adjacent to the metal material.

Accordingly, a method of forming an electronic device is disclosed. The method of claim comprises forming a monocrystalline silicon material adjacent to digit line structures and active areas of memory cells. A polycrystalline silicon material is formed adjacent to the monocrystalline silicon material and the digit line structures. The polycrystalline silicon material is selectively removed to expose the monocrystalline silicon material and the digit line structures. A monocrystalline metal silicide material is formed between the digit line structures and adjacent to the monocrystalline silicon material. A metal material is formed adjacent to the monocrystalline metal silicide material and between adjacent digit line structures.

Figure 15:
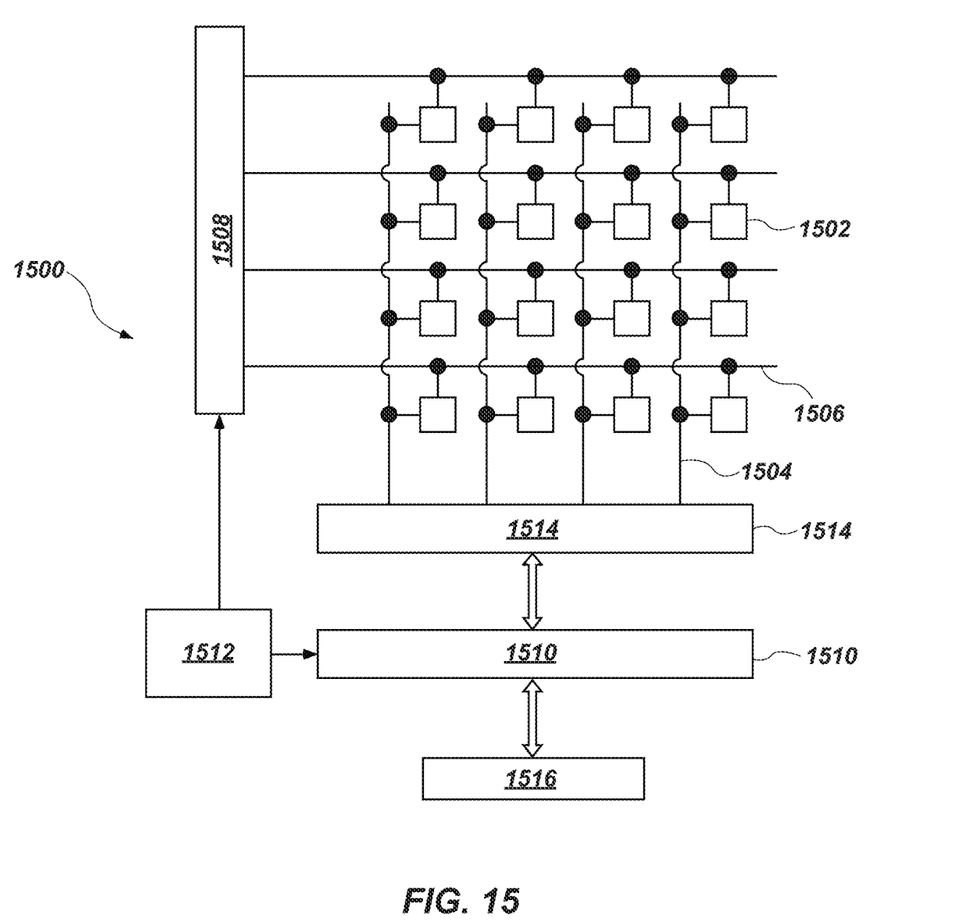
FIG. 15 is a functional block diagram of an electronic device in accordance with embodiments of the disclosure.

The apparatus 100 may be subjected to additional processing acts, as desired, to form an electronic device 1500 containing the apparatus 100, as shown in FIG. 15. Such additional processing may employ conventional processes and conventional processing equipment. The electronic device 1500 may include, for example, embodiments of the apparatus 100 previously described herein. As shown in FIG. 15, the electronic device 1500 may include memory cells 1502, digit lines 1504 (e.g., bit lines), wordlines 1506 (e.g., access lines), a row decoder 1508, a column decoder 1510, a memory controller 1512, a sense device 1514, and an input/output device 1516.

The memory cells 1502 of the electronic device 1500 are programmable to at least two different logic states (e.g., logic 0 and logic 1). Each memory cell 1502 may individually include a capacitor and transistor (not shown) and the contact structure 195 according to embodiments of the disclosure. The capacitor stores a charge representative of the programmable logic state (e.g., a charged capacitor may represent a first logic state, such as a logic 1; and an uncharged capacitor may represent a second logic state, such as a logic 0) of the memory cell 1502. The transistor grants access to the capacitor upon application (e.g., by way of one of the wordlines 1506) of a minimum threshold voltage to a semiconductive channel thereof for operations (e.g., reading, writing, rewriting) on the capacitor.

The digit lines 1504 are connected to the capacitors of the memory cells 1502 by way of the transistors of the memory cells 1502. The wordlines 1506 extend perpendicular to the digit lines 1504, and are connected to gates of the transistors of the memory cells 1502. Operations may be performed on the memory cells 1502 by activating appropriate digit lines 1504 and wordlines 1506. Activating a digit line 1504 or a wordline 1506 may include applying a voltage potential to the digit line 1504 or the wordline 1506. Each column of memory cells 1502 may individually be connected to one of the digit lines 1504, and each row of the memory cells 1502 may individually be connected to one of the wordlines 1506. Individual memory cells 1502 may be addressed and accessed through the intersections (e.g., cross points) of the digit lines 1504 and the wordlines 1506.

The memory controller 1512 may control the operations of the memory cells 1502 through various components, including the row decoder 1508, the column decoder 1510, and the sense device 1514. The memory controller 1512 may generate row address signals that are directed to the row decoder 1508 to activate (e.g., apply a voltage potential to) predetermined wordlines 1506, and may generate column address signals that are directed to the column decoder 1510 to activate (e.g., apply a voltage potential to) predetermined digit lines 1504. The memory controller 1512 may also generate and control various voltage potentials employed during the operation of the electronic device 1500. In general, the amplitude, shape, and/or duration of an applied voltage may be adjusted (e.g., varied), and may be different for various operations of the electronic device 1500.

During use and operation of the electronic device 1500, after being accessed, a memory cell 1502 may be read (e.g., sensed) by the sense device 1514. The sense device 1514 may compare a signal (e.g., a voltage) of an appropriate digit line 1504 to a reference signal in order to determine the logic state of the memory cell 1502. If, for example, the digit line 1504 has a higher voltage than the reference voltage, the sense device 1514 may determine that the stored logic state of the memory cell 1502 is a logic 1, and vice versa. The sense device 1514 may include transistors and amplifiers to detect and amplify a difference in the signals. The detected logic state of a memory cell 1502 may be output through the column decoder 1510 to the input/output device 1516. In addition, a memory cell 1502 may be set (e.g., written) by similarly activating an appropriate wordline 1506 and an appropriate digit line 1504 of the electronic device 1500. By controlling the digit line 1504 while the wordline 1506 is activated, the memory cell 1502 may be set (e.g., a logic value may be stored in the memory cell 1502). The column decoder 1510 may accept data from the input/output device 1516 to be written to the memory cells 1502. Furthermore, a memory cell 1502 may also be refreshed (e.g., recharged) by reading the memory cell 1502. The read operation will place the contents of the memory cell 1502 on the appropriate digit line 1504, which is then pulled up to full level (e.g., full charge or discharge) by the sense device 1514. When the wordline 1506 associated with the memory cell 1502 is deactivated, all of memory cells 1502 in the row associated with the wordline 1506 are restored to full charge or discharge.

Accordingly, an electronic device is disclosed and comprises a row decoder operably coupled to a memory controller, a column decoder operably coupled to the memory controller, wordlines operably coupled to the row decoder, digit lines operably coupled to the column decoder, and memory cells positioned at intersections of the wordlines and the digit lines. The memory cells comprise contact structures between an access device and a storage device, the contact structures comprising a monocrystalline metal silicide material directly contacting a monocrystalline semiconductor material and a metal material directly contacting the monocrystalline metal silicide material.

Figure 16:
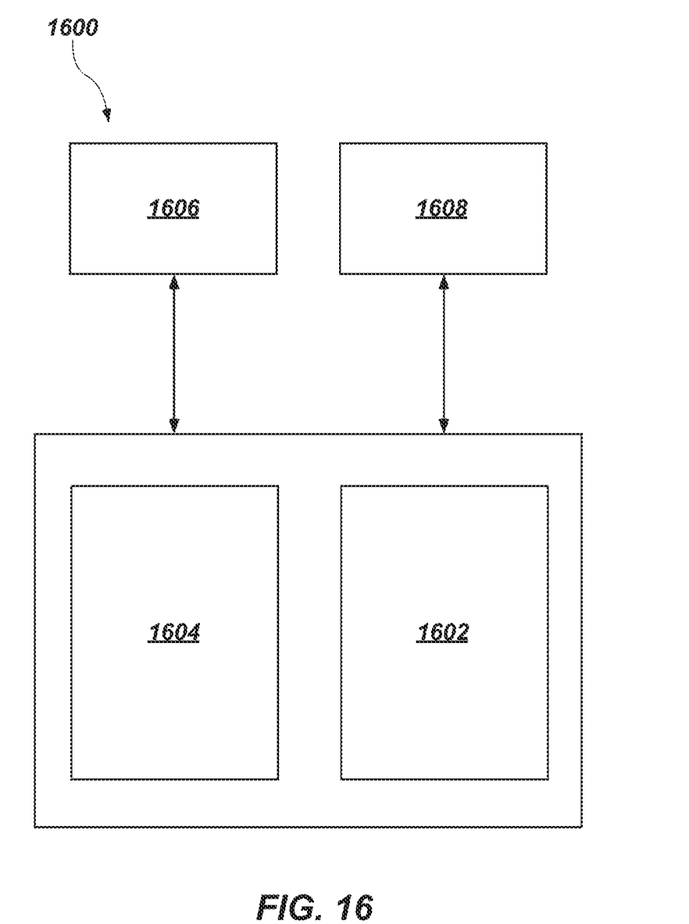
FIG. 16 is a schematic block diagram of an electronic system in accordance with embodiments of the disclosure.

The apparatus 100 according to embodiments of the disclosure may be used in embodiments of electronic systems of the disclosure. For example, FIG. 16 is a block diagram of an illustrative electronic system 1600 according to embodiments of disclosure. The electronic system 1600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 1600 includes at least one electronic device 1500. The electronic device 1500 may comprise, for example, an embodiment of one or more of the apparatus 100 previously described herein. The electronic system 1600 may further include at least one electronic signal processor device 1604 (often referred to as a "microprocessor"). The electronic signal processor device 1604 may, optionally, include an embodiment of the apparatus 100 previously described herein. The electronic system 1600 may further include one or more input devices 1606 for inputting information into the electronic system 1600 by a user, such as, for example, a mouse or other pointing device, a keyboard, a touchpad, a button, or a control panel. The electronic system 1600 may further include one or more output devices 1608 for outputting information (e.g., visual or audio output) to a user such as, for example, a monitor, a display, a printer, an audio output jack, a speaker, etc. In some embodiments, the input device 1606 and the output device 1608 may comprise a single touchscreen device that can be used both to input information to the electronic system 1600 and to output visual information to a user. The input device 1606 and the output device 1608 may communicate electrically with one or more of the electronic device 1602 and the electronic signal processor device 1604.

Accordingly, an electronic system is disclosed and comprises an input device, an output device, a processor device operably coupled to the input device and the output device, an electronic device operably coupled to the processor device and comprising memory cells. The memory cells are coupled to associated wordlines and to associated digit lines and each memory cell comprises a monocrystalline metal silicide between a monocrystalline silicon material and a metal material.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. An apparatus, comprising:
a memory array comprising wordlines, bit lines, and memory cells, each memory cell coupled to an associated wordline and an associated bit line and each memory cell comprising:
an access device;
a monocrystalline semiconductor material epitaxially grown on the access device;
a metal silicide material of a part of the monocrystalline semiconductor material and a metal;
a metal plug material over the metal silicide material; and
a storage node over the metal plug material.

2. The apparatus of claim 1, wherein the access device comprises a transistor comprising first and second diffusion regions, the monocrystalline semiconductor material being epitaxially grown on the first diffusion region.

3. The apparatus of claim 2, wherein each of the first and second diffusion regions and the monocrystalline semiconductor material comprises monocrystalline silicon.

4. The apparatus of claim 1, wherein the metal silicide material comprises a silicide of monocrystalline silicon and cobalt.

5. The apparatus of claim 4, wherein the metal plug material comprises tungsten.

6. The apparatus of claim 1, wherein the metal silicide material is between the monocrystalline semiconductor material and the metal plug material.

7. An apparatus, comprising:
a memory array comprising wordlines, digit lines, and memory cells, each memory cell coupled to an associated wordline and an associated digit line and each memory cell comprising:
a monocrystalline silicon material adjacent to an access device;
a monocrystalline metal silicide material directly contacting the monocrystalline silicon material;
a metal material directly contacting the monocrystalline metal silicide material; and
a storage device adjacent to the metal material.

8. The apparatus of claim 7, wherein the monocrystalline metal silicide material comprises monocrystalline cobalt silicide.

9. The apparatus of claim 7, wherein the monocrystalline silicon material directly contacts active areas of the memory cells.

10. The apparatus of claim 9, wherein the active areas comprises monocrystalline silicon.

11. The apparatus of claim 7, wherein the monocrystalline silicon material comprises a dopant.

12. An electronic device, comprising:
a row decoder operably coupled to a memory controller;
a column decoder operably coupled to the memory controller;
wordlines operably coupled to the row decoder;
digit lines operably coupled to the column decoder; and
memory cells positioned at intersections of the wordlines and the digit lines, the memory cells comprising contact structures between an access device and a storage device, the contact structures comprising:
a monocrystalline metal silicide material directly contacting a monocrystalline semiconductor material; and
a metal material directly contacting the monocrystalline metal silicide material.

13. The electronic device of claim 12, wherein the monocrystalline semiconductor material comprises phosphorus-doped monocrystalline silicon, the monocrystalline metal silicide material comprises monocrystalline cobalt silicide, and the metal material comprises tungsten.

14. The electronic device of claim 12, wherein the contact structures lack polycrystalline silicon.

15. The electronic device of claim 12, wherein the contact structures consist of the monocrystalline semiconductor material, the monocrystalline metal silicide material, and the metal material.

16. An electronic system, comprising:
an input device;
an output device;
a processor device operably coupled to the input device and the output device; and
an electronic device operably coupled to the processor device and comprising memory cells coupled to associated wordlines and to associated digit lines, each of the memory cells comprising:
contact structures comprising a monocrystalline metal silicide between a monocrystalline silicon material and a metal material.

17. A method of forming an apparatus, the apparatus comprising:
a memory array comprising wordlines, bit lines, and memory cells, each memory cell coupled to an associated wordline and an associated bit line and each memory cell comprising:
an access device;
a monocrystalline semiconductor material epitaxially grown on the access device;
a metal silicide material of a part of the monocrystalline semiconductor material and a metal;
a metal plug material over the metal silicide material; and
a storage node over the metal plug material, and
the method comprising:
forming the monocrystalline semiconductor material adjacent to the bit lines and active areas of memory cells;
forming a polycrystalline silicon material adjacent to the monocrystalline semiconductor material and the bit lines;
selectively removing the polycrystalline silicon material to expose the monocrystalline semiconductor material and the bit lines;
forming a monocrystalline metal silicide material between the bit lines and adjacent to the monocrystalline semiconductor material; and
forming a metal material adjacent to the monocrystalline metal silicide material and between adjacent bit lines.

18. The method of claim 17, wherein forming the monocrystalline semiconductor material and forming a polycrystalline silicon material comprises epitaxially growing the monocrystalline semiconductor material and the polycrystalline silicon material over the active areas of the memory cells.

19. The method of claim 17, wherein forming the monocrystalline semiconductor material and forming a polycrystalline silicon material comprises forming the monocrystalline semiconductor material and the polycrystalline silicon material by a continuous epitaxial growth process.

20. The method of claim 17, wherein forming the monocrystalline semiconductor material and forming a polycrystalline silicon material comprises forming a phosphorus doped monocrystalline silicon material and forming a phosphorus doped polycrystalline silicon material.

21. The method of claim 17, wherein forming the monocrystalline metal silicide material between the bit lines and adjacent to the monocrystalline semiconductor material comprises siliciding a portion of the monocrystalline semiconductor material to form the monocrystalline metal silicide material.

22. The method of claim 17, wherein forming the monocrystalline metal silicide material between the bit lines and adjacent to the monocrystalline semiconductor material comprises forming monocrystalline cobalt silicide between the bit lines and over the monocrystalline semiconductor material.

23. The method of claim 17, wherein forming the monocrystalline metal silicide material between the bit lines and adjacent to the monocrystalline semiconductor material comprises forming monocrystalline cobalt silicide directly over the monocrystalline semiconductor material.

24. The method of claim 17, wherein forming a metal material adjacent to the monocrystalline metal silicide material and between adjacent bit lines comprises forming tungsten over a monocrystalline cobalt silicide material.

25. The method of claim 17, wherein forming a metal material adjacent to the monocrystalline metal silicide material and between adjacent bit lines comprises separating the bit lines from one another by the metal material.

* * * * *